(12) United States Patent
Becker et al.

(10) Patent No.: US 9,444,062 B2
(45) Date of Patent: Sep. 13, 2016

(54) THIN-LAYER ENCAPSULATION FOR AN OPTOELECTRONIC COMPONENT, METHOD FOR THE PRODUCTION THEREOF, AND OPTOELECTRONIC COMPONENT

(75) Inventors: Dirk Becker, Langquaid (DE); Thomas Dobbertin, Regensburg (DE); Erwin Lang, Regensburg (DE); Thilo Reusch, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 13/260,560

(22) PCT Filed: Mar. 22, 2010

(86) PCT No.: PCT/EP2010/053717
§ 371 (c)(1),
(2), (4) Date: Dec. 14, 2011

(87) PCT Pub. No.: WO2010/108894
PCT Pub. Date: Sep. 30, 2010

(65) Prior Publication Data
US 2012/0132953 A1 May 31, 2012

(30) Foreign Application Priority Data

Mar. 24, 2009 (DE) .......... 10 2009 014 543
Jun. 9, 2009 (DE) .......... 10 2009 024 411

(51) Int. Cl.
*H01L 23/28* (2006.01)
*H01L 51/44* (2006.01)
*H01L 51/52* (2006.01)

(52) U.S. Cl.
CPC .......... *H01L 51/448* (2013.01); *H01L 51/5256* (2013.01); *Y02E 10/549* (2013.01); *Y02P 70/521* (2015.11)

(58) Field of Classification Search
CPC ... C07C 51/09; C07C 29/147; C07C 67/343; C07C 69/587; G02B 1/115; G11B 7/22; G11B 7/1365; H01L 51/448; H01L 51/5256; Y02P 70/521; Y02E 10/549
USPC .......... 257/100, 433, 40, E51.018, E51.012, 257/E21.502, E23.117, 790; 438/127
See application file for complete search history.

(56) References Cited

U.S. PATENT DOCUMENTS 4,507,393 A * 3/1985 Kassner .................. C03C 3/072
501/75
2001/0031379 A1 10/2001 Tera et al.
(Continued)

FOREIGN PATENT DOCUMENTS

CN 1409365 4/2003
DE 10 2008 019 900 8/2009
(Continued)

OTHER PUBLICATIONS

Al2O3/ZrO2 nanolaminates as ultrahigh gas-diffusion barriers by Jens Meyer, Feb. 19, 2009, Advanced Materials, vol. 21, Issue 18, pp. 1845-1849.*
(Continued)

*Primary Examiner* — Ken Parker
*Assistant Examiner* — Bo Fan
(74) *Attorney, Agent, or Firm* — Cozen O'Connor

(57) ABSTRACT

A thin-layer encapsulation (1) for an optoelectronic component. The thin-layer encapsulation (1) comprises a sequence of layers (2) that comprises the following layers: a first ALD layer (3) deposited by means of atomic layer deposition, and a second ALD layer (4) deposited by means of atomic layer deposition. A method is disclosed for producing the thin-layer encapsulation and an optoelectronic component is disclosed having such a thin-layer encapsulation.

11 Claims, 4 Drawing Sheets

(56) References Cited

U.S. PATENT DOCUMENTS

| | | | |
|---|---|---|---|
| 2004/0197476 A1 | 10/2004 | Skarp et al. | |
| 2005/0053788 A1* | 3/2005 | Terashima | C03B 11/08 428/411.1 |
| 2005/0181535 A1 | 8/2005 | Yun et al. | |
| 2005/0201422 A1* | 9/2005 | Ohta | G02B 1/115 372/6 |
| 2006/0017383 A1 | 1/2006 | Ishida et al. | |
| 2007/0040966 A1 | 2/2007 | Teramoto et al. | |
| 2007/0082224 A1* | 4/2007 | Friz | C01G 23/002 428/689 |
| 2007/0164376 A1* | 7/2007 | Burrows | H01L 23/562 257/412 |
| 2007/0275181 A1 | 11/2007 | Carcia et al. | |
| 2007/0295388 A1* | 12/2007 | Adriani | B32B 17/1077 136/251 |
| 2008/0169758 A1 | 7/2008 | Cok | |
| 2008/0182101 A1 | 7/2008 | Carcia | |
| 2008/0196664 A1 | 8/2008 | David et al. | |
| 2008/0241506 A1* | 10/2008 | McCormick et al. | 428/317.3 |
| 2008/0315763 A1* | 12/2008 | Dobbertin et al. | 313/512 |
| 2009/0072733 A1 | 3/2009 | Funayama et al. | |
| 2010/0215929 A1 | 8/2010 | Seo et al. | |
| 2011/0049730 A1 | 3/2011 | Schmid et al. | |
| 2011/0114992 A1 | 5/2011 | Schmid et al. | |

FOREIGN PATENT DOCUMENTS

| | | |
|---|---|---|
| EP | 1 930 250 | 7/2007 |
| JP | 2001-284042 | 10/2001 |
| JP | 2004-006491 | 1/2004 |
| JP | 2004-319331 | 11/2004 |
| JP | 2006-165537 | 6/2006 |
| JP | 2006-253106 | 9/2006 |
| JP | 2006-286616 | 10/2006 |
| JP | 2007-516347 | 6/2007 |
| JP | 2008-235760 | 10/2008 |
| JP | 2010-199060 | 9/2010 |
| JP | 2010-541159 | 12/2010 |
| JP | 2011-523167 | 8/2011 |
| WO | WO 00/60132 | 10/2000 |
| WO | WO 2006/014591 | 2/2006 |
| WO | WO 2007/091805 | 8/2007 |
| WO | WO 2009/042052 | 4/2009 |
| WO | WO 2009/042154 | 4/2009 |
| WO | WO 2009/094997 | 8/2009 |
| WO | WO 2009/139821 | 11/2009 |

OTHER PUBLICATIONS

J. Meyer et al., "Al2O3/ZrO2 Nanolaminates as Ultrahigh Gas-Diffusion Barriers—A Strategy for Reliable Encapsulation of Organic Electronics", Advanced Materials, vol. 21, No. 18, pp. 1845-1849, Feb. 19, 2009.

A.A. Dameron et al., "Gas Diffusion Barriers on Polymer Using Multilayers Fabricated by Al2O3 and Rapid SiO2 Atomic Layer Deposition", Journal of Physical Chemistry C, vol. 112, No. 12, pp. 4573-4580, Mar. 5, 2008.

S-H Park, et al., "Ultra Thin Film Encapsulation of Organic light emitting diode on plastic substrate", ETRI Journal, vol. 27, No. 5, pp. 545-550, Oct. 31, 2005.

Kwon, J. et al., "In Situ Infrared Characterization During Atomic Layer Deposition of Lanthanum Oxide", J. Phys. Chem. 113, Dec. 19, 2008, pp. 654-660.

* cited by examiner

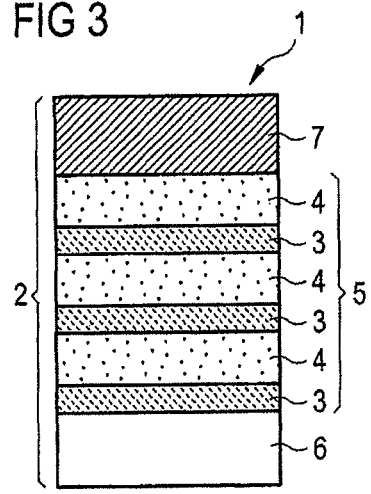
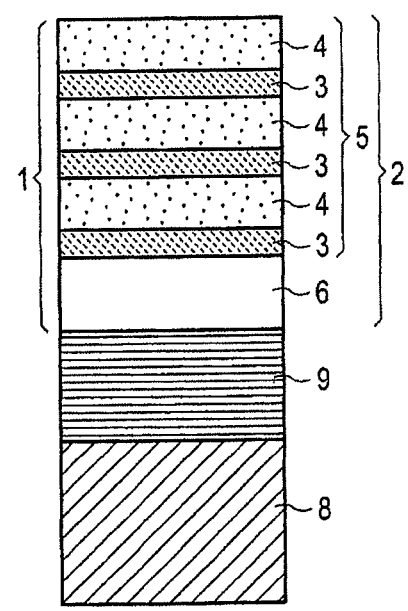

THIN-LAYER ENCAPSULATION FOR AN OPTOELECTRONIC COMPONENT, METHOD FOR THE PRODUCTION THEREOF, AND OPTOELECTRONIC COMPONENT

RELATED APPLICATIONS

This application is a U.S. National Phase Application under 35 USC 371 of International Application PCT/EP2010/053717 filed Mar. 22, 2010.

Thin-film encapsulation for an optoelectronic component, method for the production thereof, and optoelectronic component.

This patent application claims the priority of German Patent applications Nos. 10 2009 014 543.5 and filed Mar. 24, 2009 and 10 2009 024 411.5 filed Jun. 9, 2009, the disclosure content of both of which is hereby incorporated by reference.

FIELD OF THE INVENTION

The present application relates to a thin-film encapsulation for an optoelectronic component, a method for the production thereof, and an optoelectronic component.

BACKGROUND OF THE INVENTION

Optoelectronic components, and in particular those which comprise an organic functional material, such as organic light emitting diodes (OLEDs), for example, are extremely sensitive to moisture and oxygen. For protection against moisture and oxygen, OLEDs are, for example, generally encapsulated in a complicated manner with glass cavities that are adhesively bonded onto the device.

Furthermore, thin-film encapsulations comprising thin layers that seal the component against moisture and oxygen are known. Such a thin-film encapsulation is described for example in the applications DE 10 2008 031 405, DE 10 2008 048 472 and DE 10 2008 019 900. The thin-film encapsulation described therein has the disadvantage, in particular, of having only low optical transmission for visible light.

SUMMARY OF THE INVENTION

It is an object of the present invention to provide an improved thin-film encapsulation for an optoelectronic component. In particular, the thin-film encapsulation is intended to have good optical transmission for visible light. Furthermore, it is an object of the present invention to provide a method for producing the thin-film encapsulation and an optoelectronic component comprising such a thin-film encapsulation.

In the present case, "thin-film encapsulation" is understood to be a device suitable for forming a barrier with respect to atmospheric substances, in particular with respect to moisture and oxygen. In other words, the thin-film encapsulation is embodied in such a way that it can be penetrated by atmospheric substances, such as water or oxygen, at most to the extent of very small portions. This barrier effect is produced in the case of the thin-film encapsulation substantially by thin layers that are part of the thin-film encapsulation. The layers of the thin-film encapsulation generally have a thickness of less than or equal to a few 100 nm.

In accordance with one embodiment, the thin-film encapsulation consists of the thin layers that are responsible for the barrier effect of the thin-film encapsulation.

A thin-film encapsulation for an optoelectronic component having good transmission for visible light comprises, in particular, a layer sequence comprising the following layers:
  a first ALD layer, which was deposited by means of atomic layer deposition, and
  a second ALD layer, which is likewise deposited by means of atomic layer deposition.

It should be pointed out at this juncture that the layer sequence is not restricted to two ALD layers. Moreover, the layer sequence can comprise further ALD layers. Likewise, the layer sequence can comprise further layers produced by means of methods other than atomic layer deposition.

A layer sequence which comprises only ALD layers is also designated as a "nanolaminate" in the present case.

In the present case, "atomic layer deposition" (ALD) designates a method in which a first gaseous starting compound is fed to a volume in which a surface to be coated is provided, such that the first gaseous compound can adsorb on the surface. After the surface has been preferably completely or almost completely covered with the first starting compound, that part of the first starting compound which is present such that it is still gaseous and/or has not been adsorbed on the surface is generally removed again from the volume and a second starting compound is fed. The second starting compound is provided for reacting chemically with the first starting compound, which has adsorbed at the surface, to form a solid ALD layer.

It should be pointed out at this juncture that more than two starting compounds can also be used during atomic layer deposition.

During atomic layer deposition it is generally advantageous if the surface to be coated is heated to a temperature above room temperature. The reaction for forming the solid ALD layer can thereby be initiated thermally. In this case, the temperature of the surface to be coated is generally dependent on the starting compounds.

In the present case, plasmaless atomic layer deposition (PLALD) denotes an ALD method for which no plasma is produced, as described hereinafter, rather in which, for forming the solid layer, the reaction of the starting compounds is only initiated by means of the temperature of the surface to be coated.

In the case of a PLALD method, the temperature of the surface to be coated is generally between 60° C. and 120° C., inclusive of the limits.

Furthermore, in the present case, plasma-enhanced atomic layer deposition (PEALD) denotes an ALD method in which the second starting compound is fed with a plasma being produced at the same time, as a result of which the second starting compound is intended to be excited. As a result, in comparison with a plasmaless ALD method, the temperature to which the surface to be coated has to be heated can be reduced and the reaction between the starting compounds can nevertheless be initiated by the production of plasma. In the case of PEALD, the temperature of the surface to be coated is preferably less than or equal to 120° C., particularly preferably less than or equal to 80° C.

In particular, a PEALD method can be advantageous if initiation of the reaction between the starting compounds necessitates a surface temperature at which the component to be encapsulated could be damaged.

In the case of the thin-film encapsulation, the first ALD layer is particularly preferably in direct contact with the second ALD layer. This means that the first ALD layer and the second ALD layer have a common interface.

Furthermore, the first ALD layer is particularly preferably different than the second ALD layer with regard to the material. In this way, it is possible to adapt the optical properties of the thin-film encapsulation in such a way that the transmission thereof for visible light is increased.

Suitable materials for the first and/or the second ALD layer are: aluminum oxide, zinc oxide, zirconium oxide, titanium oxide, hafnium oxide, lanthanum oxide.

Preferably, the ALD layers of the layer sequence are embodied as particularly thin; by way of example, they have a thickness of between one atomic layer and 10 nm, inclusive of the limits. This generally contributes to high optical transmission of the thin-film encapsulation.

Particularly preferably, a thin-film encapsulation comprises a nanolaminate, wherein the first ALD layer comprises aluminum oxide or consists of aluminum oxide and the second ALD layer comprises zinc oxide or consists of zinc oxide, wherein the first ALD layer and the second ALD layer are in direct contact with one another. Such a nanolaminate has, in particular, particularly high optical transmission for visible light, in conjunction with a good barrier effect.

In a further particularly preferred embodiment, a thin-film encapsulation comprises a nanolaminate, wherein the first ALD layer comprises aluminum oxide or consists of aluminum oxide and the second ALD layer comprises titanium oxide or consists of titanium oxide, wherein the first ALD layer and the second ALD layer are particularly preferably in direct contact with one another. Particularly preferably, the nanolaminate terminates with an ALD layer comprising titanium oxide or consisting of titanium oxide, that is to say an outer area of the thin-film encapsulation is formed by an ALD layer comprising titanium oxide or consisting of titanium oxide. Such a nanolaminate, too, has, in particular, particularly high optical transmission for visible light, in conjunction with a good barrier effect.

In accordance with a further embodiment, the layer sequence of the thin-film encapsulation comprises at least one further layer which was deposited by thermal vapor deposition or by means of a plasma-assisted process such as sputtering or plasma-enhanced chemical vapor deposition (PECVD).

Suitable materials for the further layer are: silicon nitride, silicon oxide, silicon oxynitride, indium tin oxide, indium zinc oxide, aluminum-doped zinc oxide, aluminum oxide and mixtures and alloys thereof.

The further layer has, for example, a thickness of between 1 nm and 5 μm, inclusive of the limits. Particularly preferably, the further layer has a thickness of between 1 nm and 400 nm, once again inclusive of the limits.

In accordance with one particularly preferred embodiment, the further layer is arranged at an outer side of the layer sequence. In accordance with one preferred embodiment of the thin-film encapsulation, the latter comprises a nanolaminate, onto which a further layer is arranged in direct contact.

A particularly preferred thin-film encapsulation, which ensures high optical transmission for visible light and also a particularly good hermetic barrier effect, comprises a further layer, which is applied by means of a plasma-assisted process and comprises silicon nitride or consists of silicon nitride.

Additionally or alternatively, it is also possible for the layer sequence of the thin-film encapsulation to comprise a further ALD layer. Said further ALD layer can, for example, comprise of one of the following materials or consist of at least one of the said materials: aluminum oxide, zinc oxide, zirconium oxide, titanium oxide, hafnium oxide, lanthanum oxide. Particularly preferably, the further ALD layer comprises titanium oxide or consists of this material. Furthermore, the further ALD layer particularly preferably forms an outer area of the thin-film encapsulation.

In accordance with a further embodiment of the thin-film encapsulation, the layers of the layer sequence are repeated multiply, preferably periodically. Particularly preferably, the thin-film encapsulation comprises a nanolaminate, the ALD layers of which are repeated multiply or periodically within the nanolaminate. A particularly dense thin-film encapsulation can advantageously be obtained as a result of this.

In the case of the present thin-film encapsulation, it is advantageously possible, by means of suitable selection of the individual layers, in particular with regard to thickness and materials of the layers, to adapt the optical properties of the thin-film encapsulation in a desired manner. Thus, by way of example, by means of a suitable selection of layer thicknesses and materials of the layers, the transmittance and the reflectivity of the thin-film encapsulation can be adapted in a desired manner. It is advantageously possible, for instance, to obtain a thin-film encapsulation having an antireflective effect or having a desired transmittance.

The thin-film encapsulation particularly preferably has transmission for visible light that is greater than or equal to 70%. Particularly preferably, the transmission of the thin-film encapsulation for visible light is greater than or equal to 90%.

The present thin-film encapsulation is suitable for opto-electronic components, in particular since the optical properties thereof can be adapted in a desired manner.

An optoelectronic component comprises, in particular:
a substrate,
an active, radiation-generating and/or radiation-receiving zone, which is applied on the substrate, and
a thin-film encapsulation as described above.

The thin-film encapsulation is preferably applied between the active zone and the substrate. This arrangement advantageously protects the sensitive active zone, in particular.

In order to produce such an arrangement, in general firstly the thin-film encapsulation is applied to the substrate and then the active zone is applied above the thin-film encapsulation.

The present thin-film encapsulation is suitable, in particular, for being applied to flexible substrates such as metal films or plastic films, for example, since the latter, on account of the small thickness of the thin-film encapsulation, do not lose their flexibility as a result of the thin-film encapsulation.

In accordance with a further preferred embodiment, the thin-film encapsulation is fitted above the active zone in such a way that the radiation generated or received in the active zone passes through the thin-film encapsulation.

The present thin-film encapsulation is suitable, in particular, for being applied in the case of an organic light emitting diode, an organic photovoltaic cell, a solar cell, or in the case of an optoelectronic component comprising organic electronics—such as e.g. transistors, diodes or organic integrated circuits.

In the method for producing a thin-film encapsulation for an optoelectronic component, a first ALD layer and a second ALD layer are deposited in each case by means of atomic layer deposition. The advantageous configurations described above in connection with the thin-film encapsulation are analogously applicable to the method as well.

BRIEF DESCRIPTION OF THE DRAWINGS

FIGS. 1 to 3 show schematic sectional illustrations of a respective thin-film encapsulation in accordance with a respective exemplary embodiment, FIGS. 4 to 6 show schematic sectional illustrations of a respective optoelectronic component in accordance with a respective exemplary embodiment.

DETAILED DESCRIPTION OF THE DRAWINGS

In the exemplary embodiments and figures, identical or identically acting constituent parts are in each case provided with the same reference symbols. The elements illustrated and the size relationships among one another should not be regarded as true to scale; rather, individual elements, in particular layer thicknesses, may be illustrated by an exaggerated size in order to afford a better understanding.

Figure 1:
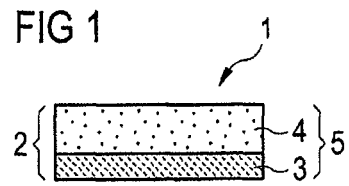

The thin-film encapsulation 1 in accordance with the exemplary embodiment in FIG. 1 comprises a layer sequence 2 comprising a first ALD layer 3, which was deposited by atomic layer deposition, and a second ALD layer 4, which was likewise deposited by atomic layer deposition. The first ALD layer 3 and the second ALD layer 4 are, in particular, in direct contact with one another.

The first ALD layer 3 comprises or consists of aluminum oxide, for example, while the second ALD layer 4 consists of zinc oxide or comprises zinc oxide. Since, in the present case, the two ALD layers 3, 4 consist of two different materials, the transmission thereof with respect to visible light is increased, since interference effects that can reduce the transmission in the case of a single ALD layer can at least be reduced. Furthermore, the use of two different materials for the first ALD layer 3 and the second ALD layer 4 has the advantage that small diffusion channels in the ALD layers 3, 4 can be better closed.

Further suitable materials for the ALD layers 3, 4 are, for example, zirconium oxide, titanium oxide, hafnium oxide and lanthanum oxide.

In the exemplary embodiment in accordance with FIG. 1, the thickness of the first ALD layer 3 is approximately 10 nm, while the second ALD layer 4 has a thickness of approximately 1 nm.

The two ALD layers 3, 4 in accordance with the exemplary embodiment in FIG. 1 form a nanolaminate 5. Such a nanolaminate 5 by itself can be suitable for constituting a sufficient barrier effect with respect to atmospheric influences such as moisture or oxygen.

A thin-film encapsulation 1 in accordance with the present application can furthermore be formed by a nanolaminate 5 wherein the ALD layers 3, 4 are repeated periodically.

Figure 2A:
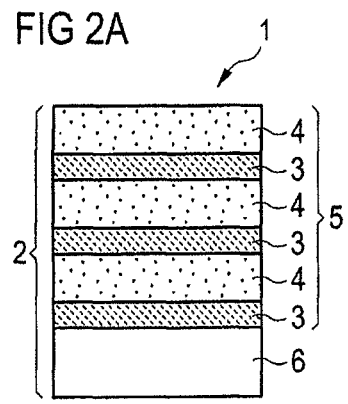

The thin-film encapsulation 1 in accordance with the exemplary embodiment in FIG. 2A comprises a nanolaminate 5, for example, wherein the ALD layers 3, 4 of the nanolaminate in accordance with FIG. 1 are repeated three times periodically.

The ALD layers 3, 4 here are in each case arranged in direct contact with one another, that is to say that they form a common interface in each case.

In one particular preferred embodiment, the ALD layers 3, 4 of the nanolaminate 5 in FIG. 1 are repeated at least five times. This is not illustrated for reasons of clarity.

Alongside the nanolaminate 5, the layer sequence 2 of the thin-film encapsulation 1 in accordance with FIG. 2A additionally comprises a further layer 6, which is not applied by means of atomic layer deposition, but rather for example by thermal evaporation or plasma-assisted methods, such as sputtering or PECVD, for instance.

In this case, the further layer 6 is arranged in direct contact with the outermost first ALD layer 3 of the nanolaminate 5.

In the exemplary embodiment in FIG. 2A, the further layer 6 comprises silicon nitride or consists of silicon nitride and has a thickness of approximately 90 nm, for example.

Alongside silicon nitride, the materials silicon oxide, silicon oxynitride, indium tin oxide, indium zinc oxide, aluminum-doped zinc oxide, aluminum oxide and mixtures and alloys thereof are suitable for the further layer 6.

Figure 2B:
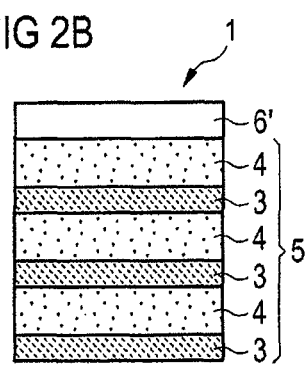

The thin-film encapsulation 1 in accordance with the exemplary embodiment in FIG. 2B comprises a first ALD layer 3, which, as in the exemplary embodiment in accordance with FIG. 2A, comprises aluminum oxide, or consists of aluminum oxide. Furthermore, the thin-film encapsulation 1 comprises a second ALD layer 4, which comprises titanium oxide or consists of titanium oxide. The first ALD layer 3 is applied to the second ALD layer 4 in direct contact. The nanolaminate 5 in accordance with the exemplary embodiment in FIG. 2B is formed by a triple periodic repetition of a first ALD layer 3, which comprises aluminum oxide or consists of aluminum oxide, and a second ALD layer 4, which comprises titanium oxide or consists of titanium oxide. Furthermore, it is also possible for the nanolaminate 5 to be formed by a quadruple or, for instance, five-fold periodic repetition of such first and second ALD layers 3, 4.

The thickness of the first ALD layer 3 and of the second ALD layer 4 is preferably between one atomic layer and 10 nm. By way of example, the thickness of the first ALD layer 3, which comprises aluminum oxide or consists of aluminum oxide, is approximately 2 nm. The thickness of the second ALD layer 4, which comprises titanium oxide or consists of titanium oxide, is between approximately 7 nm and approximately 9 nm, for example, inclusive of the limits.

Particularly preferably, the thin-film encapsulation in accordance with the exemplary embodiment in FIG. 2B is provided for being applied to an optoelectronic component by the first ALD layer 3, which comprises aluminum oxide or consists of aluminum oxide, such that a second ALD layer 4, which comprises titanium oxide or consists of titanium oxide, forms an outer area of the thin-film encapsulation 1. Furthermore, it is also possible for the layer sequence 2 of the thin-film encapsulation 1 to comprise a further ALD layer 6', which likewise comprises titanium oxide or consists of titanium oxide and which forms the outer area of the thin-film encapsulation 1. Such a further ALD layer 6' comprising titanium oxide or consisting of titanium oxide has a thickness of approximately 8 nm, for example.

The thin-film encapsulation 1 in accordance with the exemplary embodiment in FIG. 3 differs from the thin-film encapsulation 1 in accordance with FIG. 2A in that its layer sequence 2 comprises a second further layer 7. The second further layer 7 is applied to that side of the nanolaminate 5 which is remote from the first other layer 6, in direct contact with said nanolaminate. The second further layer 7 can comprise the same material as the first further layer 6 or else a different material.

The optoelectronic component in accordance with the exemplary embodiment in FIG. 4 comprises a substrate 8, to which an active zone 9 is applied. In the present case, the active zone 9 is suitable for receiving or emitting radiation.

The active zone 9 of the component comprises an organic functional material, for example. Alternatively, the active zone 9 can also comprise an inorganic active material.

The optoelectronic component can be, for example, an organic light emitting diode, an organic photovoltaic cell or a solar cell. Furthermore, the optoelectronic component can also comprise organic electronics—such as, for instance, transistors, diodes or organic integrated circuits.

A thin-film encapsulation 1 in accordance with the exemplary embodiment in FIG. 2A is applied to the active zone 9 of the optoelectronic component. The thin-film encapsulation 1 is applied to the active zone 9 in such a way that the further layer 6 faces the active zone 9 and the radiation generated or received in the active zone 9 passes through the thin-film encapsulation 1.

Instead of the thin-film encapsulation 1 in accordance with the exemplary embodiment in FIG. 2A, the optoelectronic component in accordance with FIG. 4 could also comprise a thin-film encapsulation 1 in accordance with the exemplary embodiments in FIGS. 1, 2B and 3.

Figure 5:
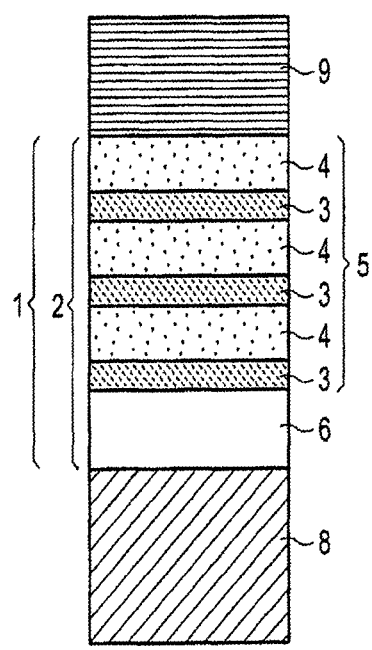
Figure 6:
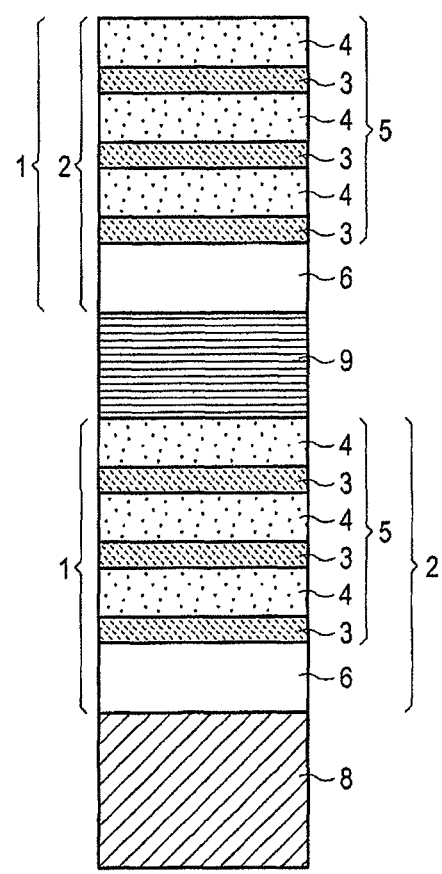

In contrast to the exemplary embodiment in accordance with FIG. 4, the optoelectronic component in accordance with the exemplary embodiment in FIG. 5 comprises a thin-film encapsulation 1 arranged between the substrate 8 and the active zone 9 of the component. In this case, the further layer 6 of the thin-film encapsulation 1 faces the substrate 8. The active zone 9 is applied on the nanolaminate 5. The optoelectronic component in accordance with the exemplary embodiment in FIG. 6 comprises two thin-film encapsulations 1. In the present case, the two thin-film encapsulations 1 are embodied identically in accordance with the exemplary embodiment in FIG. 2A. However, they can also be embodied differently from one another.

The first thin-film encapsulation 1 is arranged between substrate 8 and active zone 9 as in the case of the component in accordance with FIG. 5, while the second thin-film encapsulation 1 is arranged above the active zone 9, as in the case of the exemplary embodiment in FIG. 4.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component, which is an organic light emitting diode, comprising:
    a substrate,
    an active, radiation-generating zone, which is applied on the substrate, and
    a thin-film encapsulation which is arranged directly on the active zone comprising a layer sequence, which comprises the following layers:
    a first ALD layer deposited by atomic layer deposition, the first ALD layer consisting of lanthanum oxide; and
    a second ALD layer deposited by atomic layer deposition, the second ALD layer consisting of titanium oxide, the first ALD-layer and the second ALD-layer are in direct contact with each other and repeated multiply in an alternating manner,
    wherein:
    an outside surface of the layer sequence is formed by the second ALD layer consisting of titanium oxide, said outside surface being freely accessible, and
    the thin-film encapsulation is fitted above the active zone in such a way that the radiation generated in the active zone passes through the thin-film encapsulation.

2. The optoelectronic component according to claim 1, wherein the layer sequence of the thin-film encapsulation comprises at least one further layer which is deposited by a plasma-assisted process, or by thermal evaporation.

3. The optoelectronic component according to claim 2, wherein the further layer comprises at least one of the following materials: silicon nitride, silicon oxide, silicon oxynitride, indium tin oxide, indium zinc oxide, aluminum-doped zinc oxide, aluminum oxide and mixtures and alloys thereof.

4. The optoelectronic component according to claim 1, wherein the ALD layers has a thickness of between one atomic layer and 10 nm, inclusive of the limits.

5. The optoelectronic component according to claim 1, wherein the substrate is embodied in a flexible fashion.

6. A method for producing an optoelectronic component, which is an organic light emitting diode, comprising:
    providing a substrate,
    depositing an active, radiation-generating zone on the substrate,
    depositing a thin-film encapsulation directly on the active zone by depositing a first ALD layer by atomic layer deposition on the active, radiation-generating, the first ALD layer consisting of lanthanum oxide; and
    depositing a second ALD layer by atomic layer deposition on the first ALD layer, the second ALD layer consisting of titanium oxide,
    wherein:
    the first ALD-layer and the second ALD-layer are in direct contact with each other and repeated multiply in an alternating manner, and
    an outside surface of the thin-film encapsulation is formed by the second ALD-layer consisting of titanium oxide, said outside surface being freely accessible.

7. An optoelectronic component, which is an organic light emitting diode, comprising:
    a substrate,
    an active, radiation-generating zone, which is applied on the substrate, and
    a thin-film encapsulation, which comprises a layer sequence as follows:
    a first ALD layer deposited by atomic layer deposition, said first ALD layer consisting of titanium oxide;
    a second ALD layer deposited by atomic layer deposition, said second ALD layer consisting of aluminum oxide; and
    a further layer, which was deposited by a plasma-assisted process or by thermal evaporation, said further layer comprising silicon nitride, wherein the first and the second ALD layers are in direct contact with each other and repeated alternatingly, terminating at the first ALD layer consisting of titanium oxide such that an outside surface of the thin-film encapsulation is formed by the ALD-layer consisting of titanium oxide, said outside surface being freely accessible, and
    the layers of the layer sequence are stacked above each other in a stacking direction.

8. The optoelectronic component according to claim 2, wherein the further layer comprises silicon nitride or consists of silicon nitride.

9. The optoelectronic component according to claim 2, wherein the further layer has a thickness between 1 nm and 5 μm, inclusive of the limits.

10. The optoelectronic component according to claim 2, wherein the further layer has a thickness between 1 nm and 400 nm, inclusive of the limits.

11. The optoelectronic component according to claim 2 wherein the plasma-assisted process is sputtering or PECVD.

\* \* \* \* \*

UNITED STATES PATENT AND TRADEMARK OFFICE
CERTIFICATE OF CORRECTION

PATENT NO. : 9,444,062 B2  
APPLICATION NO. : 13/260560  
DATED : September 13, 2016  
INVENTOR(S) : Dirk Becker et al.

Page 1 of 1

It is certified that error appears in the above-identified patent and that said Letters Patent is hereby corrected as shown below:

In the Claims

In Claim 6, Line 8, after "radiation-generating" and before the "," insert --zone--.

Signed and Sealed this
Twenty-seventh Day of December, 2016

Michelle K. Lee
*Director of the United States Patent and Trademark Office*